(12) United States Patent
Armit

(10) Patent No.: US 7,348,557 B2
(45) Date of Patent: Mar. 25, 2008

(54) SCANNING PARTICLE BEAM INSTRUMENT

(75) Inventor: Andrew Philip Armit, Cambridge (GB)

(73) Assignee: Carl Zeiss SMT Limited, Cambridge (GB)

(*) Notice: Subject to any disclaimer, the term of this patent is extended or adjusted under 35 U.S.C. 154(b) by 184 days.

(21) Appl. No.: 11/208,492

(22) Filed: Aug. 22, 2005

(65) Prior Publication Data
US 2006/0060783 A1    Mar. 23, 2006

(30) Foreign Application Priority Data
Sep. 3, 2004   (GB) ................................ 0419571.5

(51) Int. Cl.
*G01J 1/20* (2006.01)
(52) U.S. Cl. ................. 250/310; 250/201.1; 250/201.3
(58) Field of Classification Search ................. 250/310
See application file for complete search history.

(56) References Cited
U.S. PATENT DOCUMENTS

| 3,886,305 A | * | 5/1975 | Yew et al. ................... 348/673 |
| 4,099,054 A | * | 7/1978 | Okumura et al. ........... 250/306 |
| 4,249,244 A | * | 2/1981 | Shofner et al. ............. 250/573 |
| 4,433,247 A | * | 2/1984 | Turner ..................... 250/492.2 |
| 5,825,670 A | * | 10/1998 | Chernoff et al. .............. 702/85 |
| 6,852,982 B1 | * | 2/2005 | Bierhoff et al. ...... 250/396 ML |

* cited by examiner

*Primary Examiner*—Jack I. Berman
*Assistant Examiner*—Andrew Smyth
(74) *Attorney, Agent, or Firm*—Barnes & Thornburg LLP

(57) ABSTRACT

A scanning particle beam instrument is provided, the instrument including a scanner, a radiation detector and a DC amplifier, the DC amplifier being operable to amplify a signal generated by the radiation detector to produce a video signal, the instrument further including a controller operable to so direct the beam relative to a specimen, or to determine when the beam is so directed relative to a specimen, that an actual video signal produced by the DC amplifier may be compared with a desired video signal, to compare actual and desired video signals and to adjust a DC offset of the DC amplifier so as to reduce a difference between the signals. Also provided is a method of producing a video signal using such an instrument.

21 Claims, 4 Drawing Sheets

SCANNING PARTICLE BEAM INSTRUMENT

FIELD OF THE INVENTION

This invention relates to a scanning particle beam instrument such as a scanning electron microscope (SEM), and to a method of producing a video signal using a scanning particle beam instrument.

BACKGROUND TO THE INVENTION

Scanning particle beam instruments are, of course, well known. Such an instrument typically includes a scanner, a radiation detector and a DC amplifier, the scanner being operable to scan a beam of charged particles in a predetermined pattern relative to a specimen, the radiation detector being operable to generate a signal representative of an instantaneous intensity of radiation resulting from interaction of the beam and a specimen, and the DC amplifier being operable to amplify the signal generated by the radiation detector to produce a video signal suitable for transmission to a display device to cause an image of a scanned portion of a specimen to be displayed.

In this specification, "radiation" includes any particle or electromagnetic radiation that may be emitted by or reflected from a specimen. A "video signal" is a varying DC signal variable between a lower signal level that would be represented by a display device as black, and an upper signal level that would be represented by the display device as white. Signal levels between the lower and upper signal levels would be represented by the display device as shades of grey.

The varying DC signal that forms the video signal may be thought of as consisting of a constant DC signal component and a superimposed varying AC signal component. FIG. 1a of the accompanying drawings shows such a varying DC signal (denoted by reference numeral 4) and FIGS. 1b and 1c show, respectively, the constant DC signal component 6 and varying AC signal component 8 that make up the varying DC signal 4 of FIG. 1a.

The radiation detector of the scanning particle beam instrument is usually subject to a DC offset, such that the signal generated by the detector includes an unwanted DC signal component. The signal generated by the detector, including the unwanted DC signal component, is amplified by the DC amplifier. The DC amplifier is itself usually subject to a DC offset, such that the video signal produced by the DC amplifier includes an unwanted DC signal component made up of the amplified DC offset introduced by the radiation detector, together with the DC offset introduced by the DC amplifier.

The DC offsets of the detector and DC amplifier are in general subject to drift so that the magnitude of the unwanted DC signal component of the video signal varies over time, the variable unwanted DC signal component of the video signal manifesting itself as regions of varying brightness in images displayed by a display device. Depending on the rate at which the DC offsets drift, and the rate at which the beam of charged particles is scanned relative to a specimen, the regions of varying brightness can be portions of individual lines of the images, entire lines or multiples of entire lines of the images, or even consecutive frames of the images, such that the images appear to flicker.

It is possible significantly to reduce the effect of the DC offset of the detector by capacitor-coupling the DC amplifier to the detector, so as to prevent the DC signal component of the signal generated by the detector, which includes the unwanted DC signal component introduced by the DC offset of the detector, from reaching the DC amplifier. This gives rise to an intermediate signal consisting of the amplified AC signal component of the signal generated by the detector and an unwanted DC signal component introduced by the DC offset of the DC amplifier.

It is then necessary to add a DC signal component to the intermediate signal to obtain the video signal. At present this is done by periodically determining a mean value of the amplified AC signal component, and adding to the amplified AC signal component a DC signal component derived from the mean value of the amplified AC signal component. This works well unless the signal generated by the detector is consistently low or consistently high during the period in which the mean value of the amplified AC signal component is determined, because this causes the mean value of the amplified AC signal component to vary, and hence the DC signal component derived from the mean value of the amplified AC signal component to vary. The variable DC signal component of the video signal also manifests itself as regions of varying brightness in images displayed by a display device.

SUMMARY OF THE INVENTION

According to a first aspect of the invention there is provided a scanning particle beam instrument that includes a scanner, a radiation detector and a DC amplifier, the scanner being operable to scan a beam of charged particles in a predetermined pattern relative to a specimen, the radiation detector being operable to generate a signal representative of an instantaneous intensity of radiation resulting from interaction of the beam and a specimen, and the DC amplifier being operable to amplify the signal generated by the radiation detector to produce a video signal suitable for transmission to a display device to cause an image of a scanned portion of a specimen to be displayed, wherein the instrument also includes a controller operable periodically to so direct the beam relative to a specimen, or to determine when the beam is so directed relative to a specimen, that an actual video signal produced by the DC amplifier may be compared with a desired video signal, to compare an actual video signal and a desired video signal, and to adjust a DC offset of the DC amplifier so as to reduce a difference between the actual video signal and the desired video signal.

The invention therefore provides apparatus that is operable to produce a video signal that is substantially unaffected by any DC offset of the radiation detector or the DC amplifier, or by any drift of any such DC offset.

The controller may advantageously be operable to interrupt operation of the scanner, to direct the beam to a predetermined portion of the specimen, and to compare the actual video signal produced by the DC amplifier with the desired video signal while the beam is directed to the predetermined portion of the specimen.

To that end the controller may advantageously be operable to cause the scanner to direct the beam to the predetermined portion of the specimen.

This approach has the disadvantage that repeated direction of the beam to the predetermined portion of the specimen may alter the predetermined portion, for example damage the predetermined portion by burning it.

Moreover, interruption of operation of the scanner and causing the scanner to direct the beam to the predetermined portion of the specimen would be inconvenient and probably costly to implement.

Preferably, therefore, the controller is operable to determine when the beam is directed to a predetermined portion of a specimen as the scanner scans the beam in the predetermined pattern relative to the specimen, and to compare the actual video signal produced by the DC amplifier with the desired video signal while the beam is directed to the predetermined portion of the specimen.

In that case the predetermined portion of the specimen is preferably chosen such that the beam is directed to the predetermined portion several times as the scanner scans the beam in the predetermined pattern relative to the specimen. Of course, each time the beam is directed to the predetermined portion it will be directed to a different region of the predetermined portion, as a result of the scanning of the beam in the predetermined pattern.

It will be appreciated by those skilled in the art that the scanner scans the beam in the predetermined pattern relative to the specimen relatively slowly, and may take as long as two minutes to complete the predetermined pattern. Even at rather faster scanning speeds than this, there is nevertheless plenty of time for the controller to compare the actual and desired video signals and to adjust the DC offset of the DC amplifier while the beam is directed to the predetermined portion of the specimen, without any need to cause the beam to dwell on the predetermined portion.

Where the controller is operable to compare the actual video signal produced by the DC amplifier with the desired video signal while the beam is directed to the predetermined portion of the specimen, a user of the instrument can choose a shade from black to white by which a display device is to represent the predetermined portion of the specimen. The desired video signal is then that which is represented by a display device as the shade chosen by the user.

Such operation of the controller gives the user of the instrument considerable freedom to determine the appearance of images of the specimen produced using the instrument, but requires on the part of the user knowledge of the characteristics of at least the predetermined portion of the specimen, and a relatively high level of skill in operating the instrument.

Alternatively or additionally, therefore, the controller may advantageously be operable to direct the beam away from the specimen, and to compare the actual video signal produced by the DC amplifier with the desired video signal while the beam is directed away from the specimen.

Preferably the controller is operable, when directing the beam away from the specimen, to cause the beam to impinge on a surface that does not emit or reflect radiation that can be detected by the detector, so that the desired video signal is that which is represented by a display device as black.

The controller may advantageously be operable to cause the scanner to direct the beam away from the specimen.

This approach, however, suffers from the disadvantage mentioned above, that interruption of the operation of the scanner would be required, which would be inconvenient to implement.

Preferably, therefore, the instrument further includes an electrostatic beam blanker and the controller is operable to cause the beam blanker to direct the beam away from the specimen.

In preferred embodiments of the invention the instrument includes a charged particle gun that has at least one gun align coil operable to direct a beam of charged particles through an objective aperture of the charged particle gun, and the controller is operable to direct the beam away from the specimen by preventing the at least one gun align coil from directing the beam of charged particles through the aperture.

Use of the at least one gun align coil to direct the beam away from the specimen is technically simple to implement and cheaper than an electrostatic beam blanker.

Where the controller is operable to prevent the at least one gun align coil from directing the beam through the objective aperture, or to cause a beam blanker to direct the beam away from the specimen, the desired video signal is also that which is represented by a display device as black, and it is unnecessary to allow the user to choose the level of the desired video signal, which can be set permanently to that which is represented by a display device as black.

Such operation of the controller requires only a relatively low level of skill on the part of the user in operating the instrument.

A controller operable in this manner is more efficient than a controller operable to cause the scanner to direct the beam away from the specimen, because the at least one gun align coil acts on the beam closer to its source, where a smaller deviation of the beam is required than would be required at the scanner to prevent the beam from reaching the specimen.

In the preferred embodiments of the invention the scanner is operable to scan the beam in a raster pattern relative to the specimen, and the controller is operable to direct the beam away from the specimen during the interval between the end of one line scan of the raster pattern, and the beginning of the next line scan.

Thus, when the beam is directed away from the specimen, the signal generated by the detector consists of the DC offset of the detector. The actual video signal produced by the DC amplifier consists of the amplified DC offset of the detector and a further DC signal component, this being the DC offset of the DC amplifier.

The controller therefore adjusts the DC offset of the DC amplifier so that the actual video signal produced by the DC amplifier is that which is represented by a display device as black. With the DC offset of the DC amplifier so adjusted, when the controller directs the beam towards the specimen, the unwanted DC signal components that would otherwise have been present in the actual video signal are counteracted by the DC offset of the DC amplifier.

A departure from this operation of the controller is necessary where the DC offset of the detector is dependent on the signal produced by the detector. This is the case, for example, where a reverse-biased silicon diode is used as the detector with a large beam current.

For such a detector an adjustment to the DC offset of the DC amplifier to conform the actual video signal produced by the DC amplifier to the desired video signal when the signal produced by the detector is at a lower signal level would not be the adjustment to the DC offset required to counteract the DC offset of the detector when the signal produced by the detector is at a higher signal level.

Where such a detector is used it is believed that satisfactory operation of the instrument would be obtained by causing the DC amplifier to produce an actual video signal approximating to mid-grey and comparing the signal from the DC amplifier with a desired video signal of that which is represented by a display device as mid-grey.

The DC amplifier could be caused to produce the actual video signal approximating to mid-grey by integrating the signal generated by the detector between operations of the controller to determine the average of the signal generated by the detector (which, in general, will be mid-grey) and operating the controller to apply the average of the signal to the DC amplifier and to compare the actual video signal produced by the amplifier with the desired video signal of that which is represented by the display device as mid-grey.

This approach would, of course, be vulnerable to signals generated by the detector which are consistently low or consistently high during the period over which the average is determined.

Preferably, therefore, the DC amplifier could be caused to produce the actual video signal approximating to mid-grey by directing the beam to a predetermined portion of the specimen, as described above, which predetermined portion of the specimen it is known, or it is desired, to be represented by the display device as mid-grey.

Alternatively, the DC amplifier could be caused to produce the actual video signal approximating to mid-grey by directing the beam to a predetermined portion of the instrument, which predetermined portion it is known should produce an actual video signal approximating to mid-grey.

The controller may advantageously be operable to compare the actual video signal produced by the DC amplifier with the desired video signal and to adjust the DC offset of the DC amplifier at intervals selectable by a user of the instrument.

As stated above, the DC offsets of the detector and the DC amplifier are in general subject to drift, and such operation enables the user of the instrument to cause the controller to adjust the DC offset of the DC amplifier as often as is necessary to counteract changes in the DC offsets of the detector and DC amplifier.

Preferably, however, the scanner comprises scan coils operable to scan the beam in the raster pattern relative to the specimen, and the controller is operable to compare the actual video signal produced by the DC amplifier with the desired video signal during the line and/or field recovery time of the scan coils.

If the DC offset of the DC amplifier is adjusted by the controller at the end of each line scan of the specimen, this removes the need for the user of the instrument to decide when to cause the controller to adjust the DC offset of the DC amplifier, and is sufficiently frequent to counteract changes in the DC offsets of the detector and DC amplifier for all but the slowest scans of the beam relative to the specimen.

The DC amplifier may advantageously be capacitor-coupled to the detector.

Preferably the instrument further comprises an AC amplifier operable to amplify an AC signal component and block a DC signal component of the signal generated by the detector, the DC amplifier being operable by means of the DC offset to add a DC signal component to the signal produced by the AC amplifier, so as to produce the actual video signal.

The invention therefore further provides an instrument that is operable to produce an actual video signal from a signal generated by the detector, which actual video signal is substantially unaffected by previous values of the signal generated by the detector.

In the preferred embodiments of the invention the instrument is a scanning electron microscope (SEM).

According to a second aspect of the invention there is provided a method of generating a video signal using a scanning particle beam instrument, the method comprising the steps of directing a beam of charged particles towards a specimen, scanning the beam in a predetermined pattern relative to the specimen, detecting radiation emitted by or reflected from the specimen as a result of scanning by the beam to generate a signal representative of the instantaneous intensity of the radiation, and amplifying by means of a DC amplifier the signal representative of the instantaneous intensity of the radiation to produce an actual video signal, wherein the method further comprises the steps of periodically so directing the beam relative to the specimen, or determining when the beam is so directed relative to the specimen, that the actual video signal produced by the DC amplifier may be compared with a desired video signal, comparing an actual video signal and a desired video signal, and adjusting a DC offset of the DC amplifier so as to reduce a difference between the actual video signal and the desired video signal.

The steps of so directing the beam relative to the specimen and comparing the actual video signal produced by the DC amplifier with the desired video signal may advantageously comprise directing the beam to a predetermined portion of the specimen, and comparing the actual video signal produced by the DC amplifier with the desired video signal while the beam is directed to the predetermined portion of the specimen.

Preferably the steps of so directing the beam relative to the specimen and comparing the actual video signal produced by the DC amplifier with the desired video signal comprise directing the beam away from the specimen, and comparing the actual video signal produced by the DC amplifier with the desired video signal while the beam is directed away from the specimen.

More preferably still, the step of directing the beam away from the specimen comprises preventing the beam from reaching the specimen.

Preferably the step of scanning the beam in the predetermined pattern relative to the specimen comprises scanning the beam in a raster pattern relative to the specimen using scan coils, and the steps of directing the beam away from the specimen and comparing the actual video signal produced by the DC amplifier with the desired video signal are carried out during the line and/or field recovery time of the scan coils.

The method may advantageously further comprise the step of amplifying an AC signal component and blocking a DC signal component of the signal representative of the instantaneous intensity of the radiation by means of an AC amplifier, and, by means of the offset of the DC amplifier, adding a DC signal component to the signal produced by the AC amplifier so as to produce the actual video signal.

BRIEF DESCRIPTION OF THE DRAWING FIGURES

The invention will now be described by way of illustrative example and with reference to the accompanying drawing figures, in which.

DETAILED DESCRIPTION OF EMBODIMENTS

Figure 2:
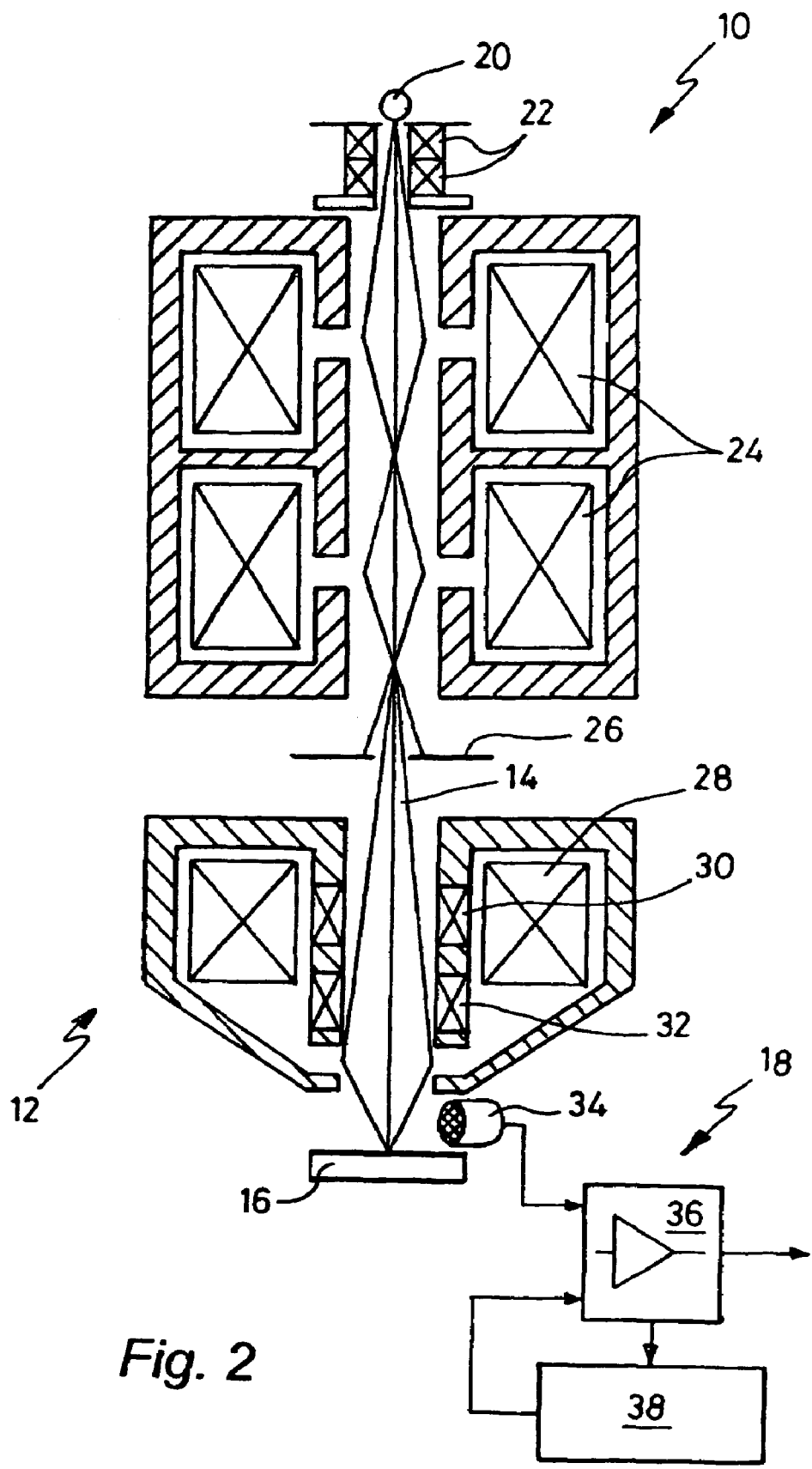
FIG. 2 is a schematic diagram of a scanning electron microscope (SEM) in accordance with the first aspect of the invention.

The scanning electron microscope (SEM) 10 of FIG. 2 comprises an electron gun assembly 12 operable to direct a beam 14 of electrons towards a specimen 16, and a radiation detector assembly 18 operable to detect radiation in the form of back-scattered electrons resulting from interaction of the beam 14 and the specimen 16, and to generate a video signal suitable for transmission to a display device to cause an image of a scanned portion of the specimen to be displayed by the display device.

The electron gun assembly 12 comprises a heated filament 20, from which electrons are emitted, gun align coils 22, a gun align circuit (not shown in FIG. 2), condenser lenses 24, objective aperture 26, objective lens 28, a scanner in the form of first and second scan coils 30 and 32, respectively, and a scan generator (not shown in FIG. 2).

The gun align coils 22 and gun align circuit direct electrons emitted from the heated filament 20 along the centre of the condenser lenses 24 to the objective aperture 26. The condenser lenses 24 focus the electrons passing through them onto the objective aperture 26. Electrons passing through the objective aperture 26 form the beam 14, which is focused onto the specimen 16 by the objective lens 28. The first and second scan coils 30 and 32 and scan generator scan the beam of electrons in a raster pattern relative to the specimen 16. As described so far, the operation of the filament 20, gun align coils 22 and circuit, condenser lenses 24, objective lens 28 and scan coils 30 and 32 and generator is identical with the operation of these components in known SEMs.

The radiation detector assembly 18 comprises a radiation detector in the form of a silicon diode 34, a DC amplifier 36, and a controller in the form of a control circuit 38.

The silicon diode 34 is reverse-biased in use, and is operable to generate a signal representative of the number of back-scattered electrons resulting from the scanning of the specimen 16 by the beam 14. The DC amplifier 36 is operable to amplify the signal generated by the diode 34 to produce a video signal suitable for transmission to a display device (not shown) such as a cathode ray tube. The control circuit 38 is operable, during the line and field flyback times of the scan coils 30 and 32 to prevent the beam 14 from reaching the specimen, to compare the actual video signal produced by the DC amplifier 36 with a desired video signal, and to adjust a DC offset of the DC amplifier 36 so as to reduce a difference between the actual video signal produced by the DC amplifier and the desired video signal.

Figure 3:
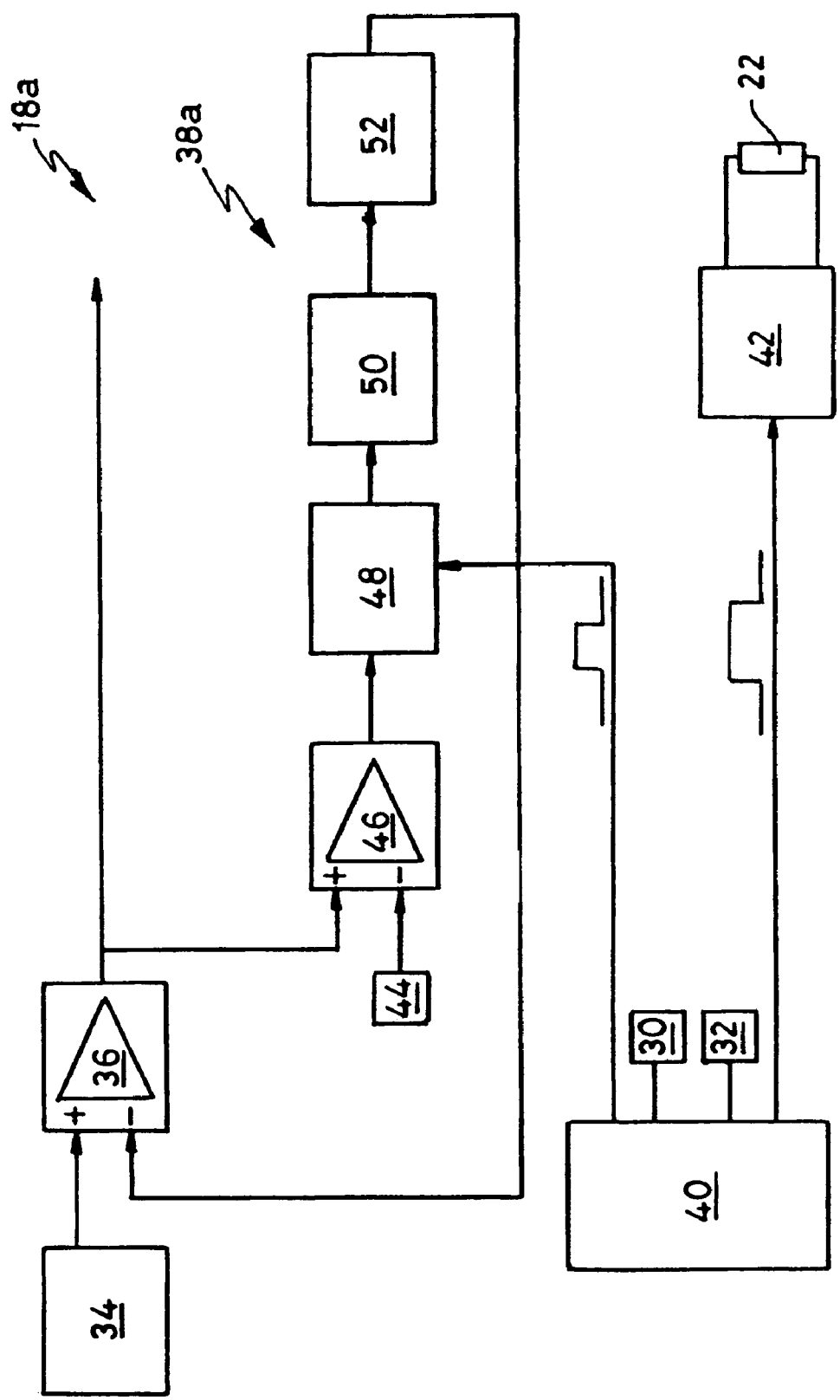
FIG. 3 is a block diagram of a first embodiment of a radiation detector assembly of the SEM of FIG. 2.

Turning to FIG. 3, this shows a first embodiment 18a of the radiation detector assembly 18 of FIG. 2, comprising the silicon diode 34, DC amplifier 36 and a first embodiment 38a of the control circuit 38 of FIG. 2. The signal generated by the diode 34 is applied to the non-inverting input of the DC amplifier 36. Also shown in FIG. 3 are the gun align coils 22, scan coils 30 and 32, the scan generator (denoted by reference numeral 40) and the gun align circuit (denoted by reference numeral 42).

The control circuit 38a comprises a desired video signal source 44, a DC amplifier 46, a sample-and-hold circuit 48, an integrator 50 and an attenuator 52, the sample-and-hold circuit 48 being controlled by the scan generator 40.

The video signal produced by the DC amplifier 36 is applied to the non-inverting input of the DC amplifier 46. A desired video signal from the desired video signal source 44 is applied to the inverting input of the DC amplifier 46. The desired video signal is that which would be represented by a display device as black. The DC amplifier 46 produces an error signal, which it transmits to the sample-and-hold circuit 48.

While the beam is scanned across the specimen by the scan coils 30 and 32 under the control of the scan generator 40, the error signal produced by the DC amplifier 46 is disregarded by the sample-and-hold circuit 48.

When the beam reaches the end of a scan line, the scan generator 40 transmits a first control signal to the gun align circuit 42, which control signal is added to the signal generated by the gun align circuit to control the gun align coils 22. The addition of the control signal to the signal generated by the gun align circuit causes the gun align coils to direct the electrons emitted from the filament 20 away from the centre of the condenser lenses 24, such that the electrons do not pass through the objective aperture 26 of the electron gun, and are prevented from reaching the specimen.

The scan generator 40 delays briefly after transmitting the first control signal to the gun align circuit 42 to allow the first control signal to act to interrupt the electron beam 14. The scan generator then transmits a second control signal to the sample-and-hold circuit 48, which samples and holds the error signal produced by the DC amplifier 46 while the electron beam is prevented from reaching the specimen.

The error signal thus sampled and held is integrated by the integrator 50, attenuated by the attenuator 52 and applied to the inverting input of the DC amplifier 36, so as to reduce the magnitude of the error signal. The integrator 50 reduces the impact on an image produced from the video signal of any spurious error signals produced by the DC amplifier 46, which might otherwise give rise to a single scan line of different brightness from the other scan lines making up the image.

The scan generator again delays briefly to allow for the line scan recovery time of the scan coils 30 and 32, or, if the previous line was the last line of the raster pattern, the field scan recovery time of the scan coils.

The scan generator then ceases to transmit the first control signal to the gun align circuit, such that the gun align coil again directs the electron beam through the narrow aperture and the electron beam again reaches the specimen; whereupon scanning of the next line of the raster pattern commences.

This process is repeated whenever the beam reaches the end of a scan line.

It should be noted that, in the first embodiment 18a of the radiation detector assembly, it is important that avalanche breakdown of the diode 34 is avoided. Avalanche breakdown is only likely to occur when the beam is directed to the specimen and the diode is detecting back-scattered electrons, and can be prevented by ensuring that the beam current does not exceed a threshold level. Avoidance of avalanche breakdown of the diode is important because the DC offset of the diode during avalanche breakdown will be very different from the DC offset of the diode during normal conduction, so that the DC offset of the DC amplifier 36, which is set by the control circuit during normal conduction of the diode, will not counteract the DC offset of the diode during avalanche breakdown.

Figure 4:
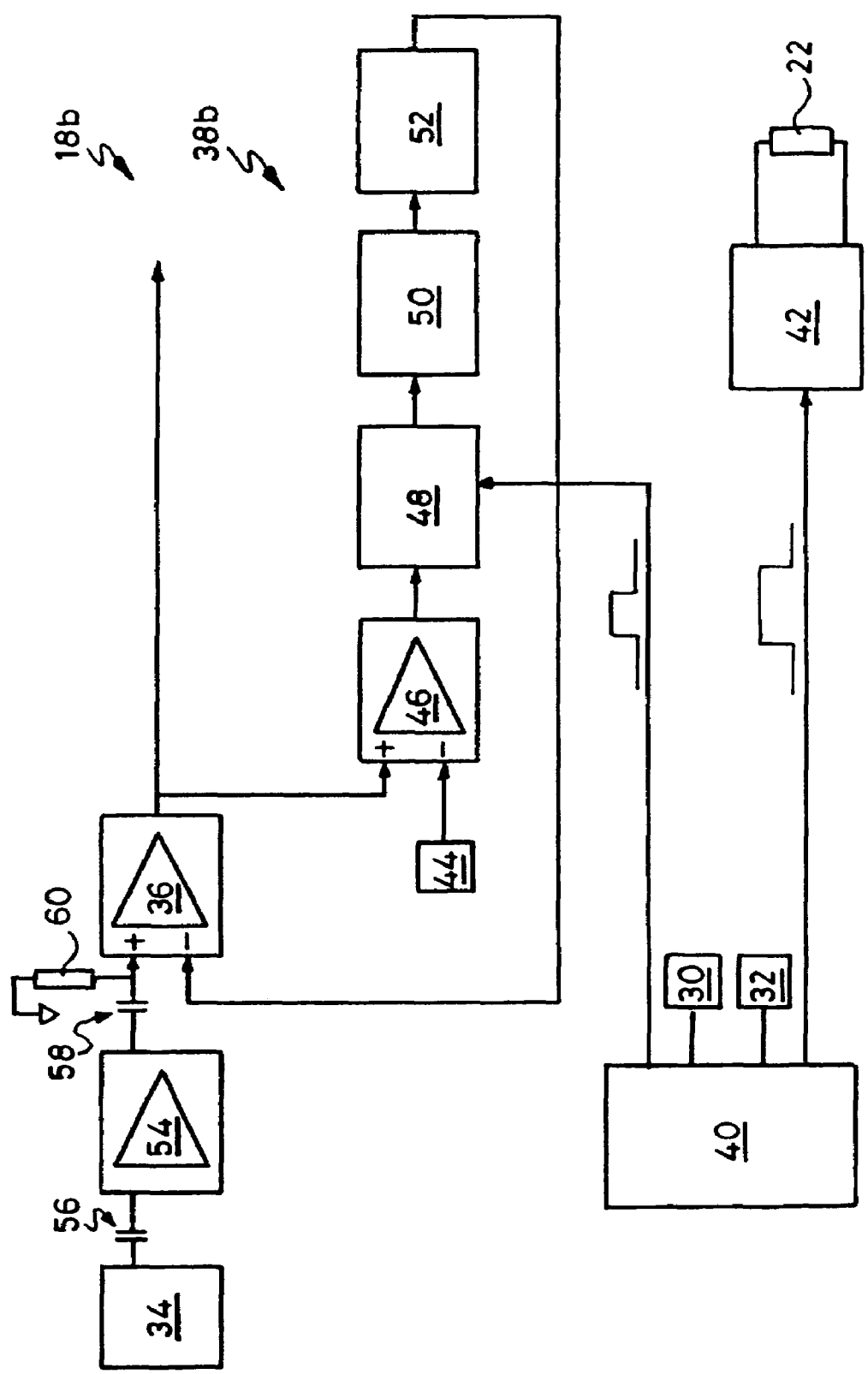
FIG. 4 is a block diagram of a second embodiment of the radiation detector assembly of the SEM of FIG. 2.

Turning to FIG. 4, this shows a second embodiment 18b of the radiation detector assembly 18 of FIG. 2, comprising the silicon diode 34, DC amplifier 36 and a second embodiment 38b of the control circuit 38 of FIG. 2. The second embodiment 38b of the control circuit differs from the first embodiment 38a in that it includes an AC amplifier 54, an input of which is coupled by a first capacitor 56 to the diode 34, and the output of which is coupled by a second capacitor 58 to the non-inverting input of the DC amplifier 36.

The other components of the radiation detector assembly are identical with, and operate in the same way as, those of the radiation detector assembly of FIG. 3, and are denoted by the same reference numerals.

The capacitor-coupling by capacitor 56 of the AC amplifier 54 to the diode 34 blocks the DC signal component of the signal produced by the diode, such that the AC amplifier 54 amplifies only the AC signal component of the signal produced by the diode. Unlike the first embodiment of the radiation detector assembly, therefore, it is unnecessary to avoid avalanche breakdown of the diode 34. However, the AC amplifier 54 itself introduces a DC signal component together with some very low frequency (less than 10 Hz, say) signal components into the amplified AC signal. The very low frequency AC signal components result from the noise characteristic of the AC amplifier 54. The capacitor-coupling by capacitor 58, of the AC amplifier 54 to the DC amplifier 36 again blocks the DC signal component of the amplified AC signal. A resistor 60 is connected between the non-inverting input of the DC amplifier 36 and ground. In addition to referencing the non-inverting input of the DC amplifier to ground, the resistor 60 also forms a high-pass filter with the capacitor 58, which serves to attenuate the very low frequency AC signal components of the amplified AC signal produced by the AC amplifier 54.

Figures 1A, 1B, 1C:
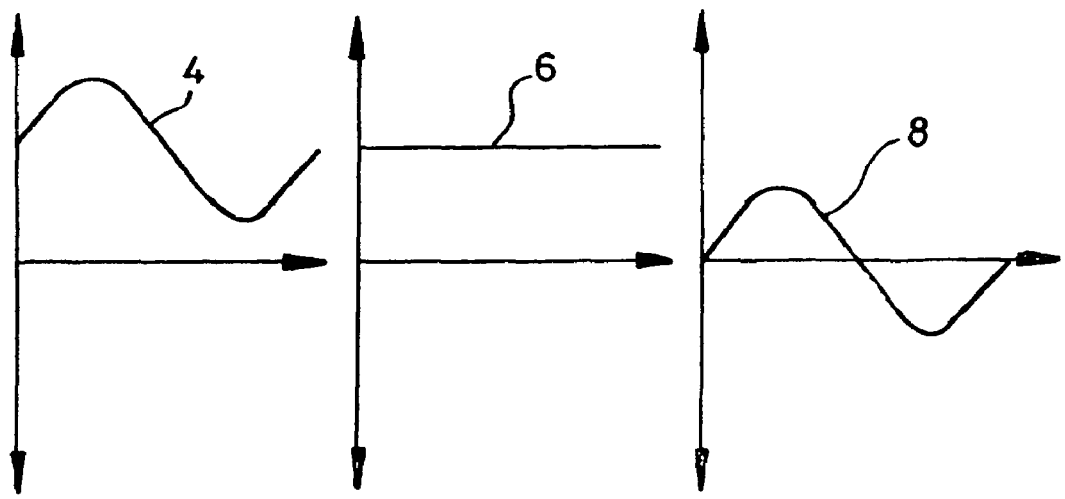
FIGS. 1a to 1c are illustrative waveforms, respectively, of a variable DC signal and the constant DC signal component and superimposed variable AC signal component that constitute the variable DC signal.
Figure 5:
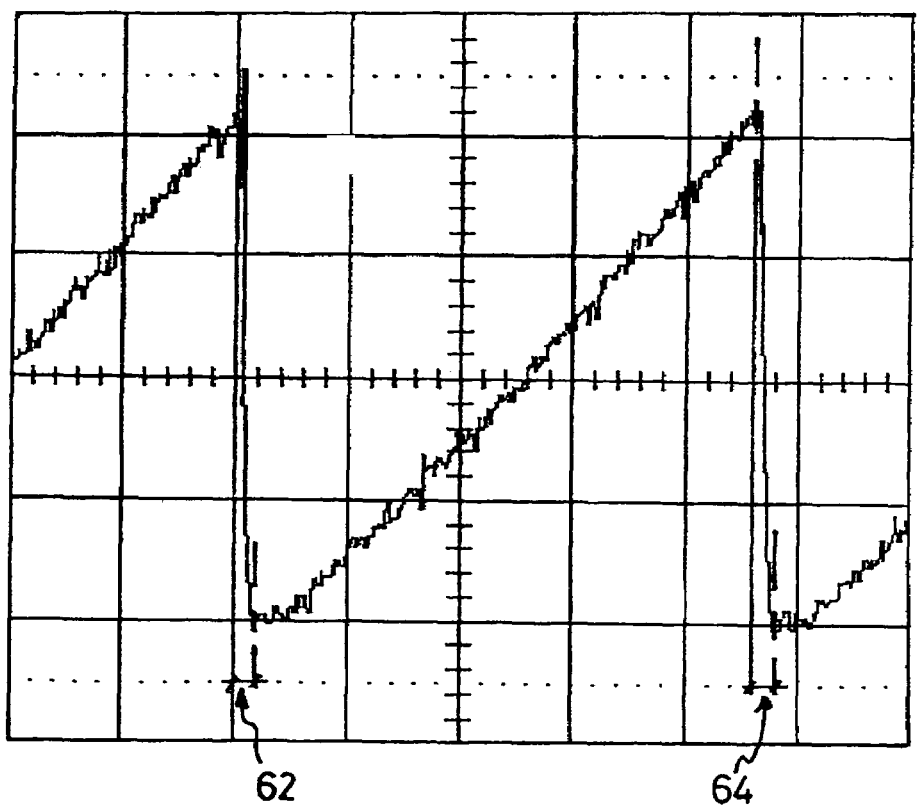
FIG. 5 is an oscillogram of a scan coil current of the SEM of FIG. 2 showing the line recovery times of the scan coil during which a method of producing a video signal in accordance with the second aspect of the invention is carried out.

Turning to FIG. 5, this shows two line recovery intervals of the scan coil 30, the line recovery intervals being denoted by reference numerals 62 and 64. The time base of the oscillogram of FIG. 5 is 0.1 ms per division. It can therefore be seen that the time available for the control circuits 38a and 38b to generate the error signal and to adjust the DC offset of the DC amplifier 36 at the end of each line scan is of the order of 20 µs, which is ample.

It will be apparent that the above description relates only to two embodiments of the invention, and that the invention encompasses other embodiments as defined by the foregoing statements of the invention.

In particular, it will be apparent that the invention encompasses not only embodiments as described above in which the radiation detector is disposed within a specimen chamber, but also embodiments with a so called in-lens detector, in which the detector is disposed within the electron gun assembly, for example within or shortly above the objective lens.

Where an in-lens detector is used, it would preferably be disposed between the objective aperture and the specimen 16, such that electrons that do not pass through the objective aperture cannot reach the detector.

The invention claimed is:

1. A scanning particle beam instrument that includes a scanner, a radiation detector and a DC amplifier, the scanner being operable to scan a beam of charged particles relative to a specimen, the radiation detector being operable to generate a signal representative of an intensity of radiation resulting from interaction of the beam and a specimen, and the DC amplifier being operable to amplify the signal generated by the radiation detector to produce a video signal, wherein the instrument also includes a controller operable to so direct the beam relative to a specimen, or to determine when the beam is so directed relative to a specimen, that an actual video signal produced by the DC amplifier may be compared with a desired video signal, to compare an actual video signal and a desired video signal, and to adjust a DC offset of the DC amplifier so as to reduce a difference between the actual video signal and the desired video signal.

2. An instrument according to claim 1, wherein the controller is operable to interrupt operation of the scanner, to direct the beam to a predetermined portion of the specimen, and to compare the actual video signal produced by the DC amplifier with the desired video signal while the beam is directed to the predetermined portion of the specimen.

3. An instrument according to claim 2, wherein the controller is operable to cause the scanner to direct the beam to the predetermined portion of the specimen.

4. An instrument according to claim 1, wherein the controller is operable to determine when the beam is directed to a predetermined portion of a specimen as the scanner scans the beam relative to the specimen, and to compare the actual video signal produced by the DC amplifier with the desired video signal while the beam is directed to the predetermined portion of the specimen.

5. An instrument according to claim 1, wherein the controller is operable to direct the beam away from the specimen, and to compare the actual video signal produced by the DC amplifier with the desired video signal while the beam is directed away from the specimen.

6. An instrument according to claim 5, wherein the controller is operable, when directing the beam away from the specimen, to cause the beam to impinge on a surface that does not emit or reflect radiation that can be detected by the detector.

7. An instrument according to claim 5, wherein the controller is operable to cause the scanner to direct the beam away from the specimen.

8. An instrument according to claim 5, wherein the instrument further includes an electrostatic beam blanker and the controller is operable to cause the beam blanker to direct the beam away from the specimen.

9. An instrument according to claim 5, wherein the instrument includes a charged particle gun that has at least one gun align coil operable to direct a beam of charged particles through an objective aperture of the charged particle gun, and the controller is operable to direct the beam away from the specimen by preventing the at least one gun align coil from directing the beam of charged particles through the aperture.

10. An instrument according to claim 1, wherein the scanner is operable to scan the beam in a raster pattern relative to the specimen, and the controller is operable to direct the beam away from the specimen during the interval between the end of one line scan of the raster pattern, and the beginning of the next line scan.

11. An instrument according to claim 1, wherein the controller is operable to compare the actual video signal produced by the DC amplifier with the desired video signal and to adjust the DC offset of the DC amplifier at intervals selectable by a user of the instrument.

12. An instrument according to claim 10, wherein the scanner comprises scan coils operable to scan the beam in the raster pattern relative to the specimen, and the controller is operable to compare the actual video signal produced by the DC amplifier with the desired video signal during the line and/or field recovery time of the scan coils.

13. An instrument according to claim 1, wherein the DC amplifier is capacitor-coupled to the radiation detector.

14. An instrument according to claim 1, wherein the instrument further comprises an AC amplifier operable to amplify an AC signal component and block a DC signal component of the signal generated by the detector, the DC amplifier being operable by means of the DC offset to add a DC signal component to the signal produced by the AC amplifier, so as to produce the actual video signal.

15. An instrument according to claim 1, wherein the instrument is a scanning electron microscope (SEM).

16. A method of generating a video signal using a scanning particle beam instrument, the method comprising the steps of directing a beam of charged particles towards a specimen, scanning the beam relative to the specimen, detecting radiation emitted by or reflected from the specimen as a result of scanning by the beam to generate a signal representative of an intensity of the radiation, and amplifying by means of a DC amplifier the signal representative of the intensity of the radiation to produce an actual video signal, wherein the method further comprises the steps of so directing the beam relative to the specimen, or determining when the beam is so directed relative to the specimen, that the actual video signal produced by the DC amplifier may be compared with a desired video signal, comparing an actual video signal and a desired video signal, and adjusting a DC offset of the DC amplifier so as to reduce a difference between the actual video signal and the desired video signal.

17. A method according to claim 16, wherein the steps of so directing the beam relative to the specimen and comparing the actual video signal produced by the DC amplifier with the desired video signal comprise directing the beam to a predetermined portion of the specimen, and comparing the actual video signal produced by the DC amplifier with the desired video signal while the beam is directed to the predetermined portion of the specimen.

18. A method according to claim 16, wherein the steps of so directing the beam relative to the specimen and comparing the actual video signal produced by the DC amplifier with the desired video signal comprise directing the beam away from the specimen, and comparing the actual video signal produced by the DC amplifier with the desired video signal while the beam is directed away from the specimen.

19. A method according to claim 16, wherein the step of directing the beam away from the specimen comprises preventing the beam from reaching the specimen.

20. A method according to claim 16, wherein the step of scanning the beam relative to the specimen comprises scanning the beam in a raster pattern relative to the specimen using scan coils, and the steps of directing the beam away from the specimen and comparing the actual video signal produced by the DC amplifier with the desired video signal are carried out during the line and/or field recovery time of the scan coils.

21. A method according to claim 16, further comprising the step of amplifying an AC signal component and blocking a DC signal component of the signal representative of the instantaneous intensity of the radiation by means of an AC amplifier, and, by means of the offset of the DC amplifier, adding a DC signal component to the signal produced by the AC amplifier so as to produce the actual video signal.

* * * * *